(12) United States Patent
Cornelius et al.

(10) Patent No.: US 7,685,454 B2
(45) Date of Patent: Mar. 23, 2010

(54) SIGNAL BUFFERING AND RETIMING CIRCUIT FOR MULTIPLE MEMORIES

(75) Inventors: William P. Cornelius, Los Gatos, CA (US); Tony S. El-Kik, Allentown, PA (US); Stephen A. Masnica, Macungie, PA (US); Parag Parikh, Allentown, PA (US); Anthony W. Seaman, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 659 days.

(21) Appl. No.: 11/601,998

(22) Filed: Nov. 20, 2006

(65) Prior Publication Data

US 2008/0013663 A1    Jan. 17, 2008

Related U.S. Application Data

(60) Provisional application No. 60/830,187, filed on Jul. 12, 2006.

(51) Int. Cl.
*G06F 1/12* (2006.01)
*H04L 7/00* (2006.01)
(52) U.S. Cl. .................. 713/400; 713/401; 375/371
(58) Field of Classification Search .......... 713/400, 713/401
See application file for complete search history.

(56) References Cited

U.S. PATENT DOCUMENTS

| | | | | |
|---|---|---|---|---|
| 5,077,761 A | * | 12/1991 | Tokunaga | ................ 375/371 |
| 5,268,656 A | | 12/1993 | Muscavage | ................ 331/45 |
| 6,178,212 B1 | * | 1/2001 | Akashi | ................ 375/355 |
| 6,449,213 B1 | * | 9/2002 | Dodd et al. | ............. 365/233.1 |
| 7,406,564 B1 | * | 7/2008 | Bain | ................ 711/118 |
| 2007/0288716 A1 | * | 12/2007 | Prete et al. | ................ 711/167 |

* cited by examiner

*Primary Examiner*—Suresh K Suryawanshi
(74) *Attorney, Agent, or Firm*—Mendelsohn, Drucker & Associates, P.C.; Steve Mendelsohn

(57) ABSTRACT

A signal buffering and retiming (SBR) circuit for a plurality of memory devices. A PLL-based clock generator generates a set of phase-shifted clock signals from a received host clock signal. Each of a plurality of phase selectors independently selects a subset of contiguous clock signals from the set of phase-shifted clock signals. Each subset of contiguous clock signals is applied to a different set of one or more verniers, each vernier independently selecting one of the contiguous clock signals as its retiming clock signal for use in generating either (1) an output clock signal or a retimed bit of address or control data for one or more of the memory devices or (2) a feedback clock signal for the PLL-based clock generator. The SBR circuit can be designed to satisfy relatively stringent signal timing requirements related to skew and delay.

20 Claims, 6 Drawing Sheets

122

134

600

SIGNAL BUFFERING AND RETIMING CIRCUIT FOR MULTIPLE MEMORIES

CROSS-REFERENCE TO RELATED APPLICATIONS

This application claims the benefit of the filing date of U.S. provisional application No. 60/830,187, filed on Jul. 12, 2006, the teachings of which are incorporated herein by reference.

The subject matter of this application is related to U.S. patent application Ser. No. 11/240,290 filed Sep. 30, 2005, the teachings of which are incorporated herein by reference.

BACKGROUND OF THE INVENTION

1. Field of the Invention

The present invention relates to computer systems, and, in particular, to circuitry for writing data to and reading data from memory devices in computer systems.

2. Description of the Related Art

In a conventional computer system, a host controller provides clock, address, and other control signals for writing data to and reading data from a memory device, such as a random access memory (RAM). Depending on the particular application, there may be relatively stringent requirements related to the timing at which these different signals are applied in parallel to the memory device. For example, system requirements may limit the difference between the earliest and latest arrival times (also referred to as the skew) of these signals to a specified maximum skew value. In addition, there may be a requirement limiting the overall signal propagation delay from the controller to the memory device to a specified maximum delay value.

In the past, a conventional computer system having two or more different memory devices would typically have separate signal buffering and retiming circuitry dedicated to meeting the skew and/or delay requirements for each different memory device.

SUMMARY OF THE INVENTION

In one embodiment, the present invention is a signal buffering and retiming (SBR) circuit for buffering and retiming signals for parallel application to a plurality of memory devices. The SBR circuit comprises a PLL-based clock generator, a plurality of phase selectors, a set of one or more output clock verniers, a set of one or more feedback clock verniers, and one or more sets of non-clock verniers. The PLL-based clock generator generates a set of phase-shifted clock signals from an input clock signal. Each phase selector independently selects a subset of contiguous clock signals from the set of phase-shifted clock signals. Each output clock vernier (1) receives a corresponding subset of contiguous clock signals from a corresponding phase selector, (2) selects one of the contiguous clock signals as its retiming clock, and (3) generates, using its retiming clock, an output clock signal for at least one of the memory devices. Each feedback clock vernier (1) receives a corresponding subset of contiguous clock signals from a corresponding phase selector, (2) selects one of the contiguous clock signals as its retiming clock, and (3) generates, using its retiming clock, a feedback clock signal provided to the PLL-based clock generator. Each non-clock vernier (1) receives a corresponding subset of contiguous clock signals from a corresponding phase selector, (2) selects one of the contiguous clock signals as its retiming clock, (3) receives a bit of address or control data, and (4) generates, using its retiming clock, a retimed bit signal from the bit of address or control data for at least one of the memory devices.

In another embodiment, the present invention is a method and apparatus for buffering and retiming signals for parallel application to a plurality of memory devices. A set of phase-shifted clock signals is generated from an input clock signal. A plurality of subsets of contiguous clock signals are independently selected from the set of phase-shifted clock signals. For a first subset of contiguous clock signals, one of the contiguous clock signals is selected as a first retiming clock and, using the first retiming clock, an output clock signal is generated for at least one of the memory devices. For a second subset of contiguous clock signals, one of the contiguous clock signals is selected as a second retiming clock and, using the second retiming clock, a feedback clock signal is generated for use in generating the set of phase-shifted clock signals. For each other subset of contiguous clock signals, one of the contiguous clock signals is selected as an other retiming clock and, using the other retiming clock, a retimed bit signal is generated from a received bit of address or control data for at least one of the memory devices.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
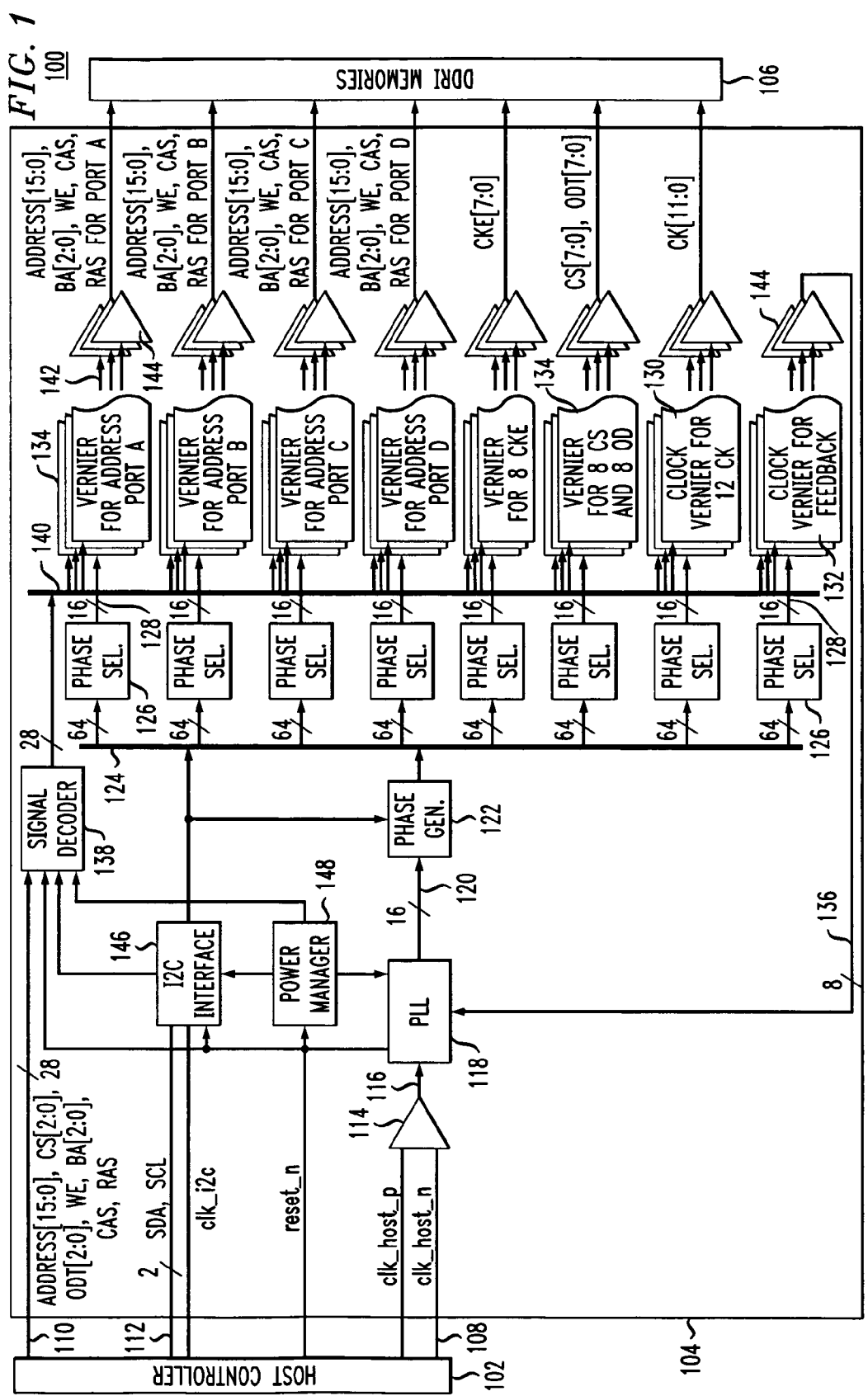
FIG. 1 shows a block diagram of a portion of a computer system having multiple memory devices, according to one embodiment of the present invention.

FIG. 1 shows a block diagram of a portion of a computer system 100 having multiple memory devices, according to one embodiment of the present invention. In this particular embodiment, the memory devices are all dual in-line memory module (DIMM) double data rate (DDR) memories. A DDR memory is capable of reading or writing data on every rising and falling edge of an applied clock signal, as opposed to a single data rate (SDR) memory, which is capable of reading or writing data only on every rising edge or only on every falling edge, but not both. Although the present invention is described in the context of a computer system having multiple DDR memories, in general, the present invention can be implemented in computer systems having a plurality of memories in any combination of DDR and/or SDR devices.

In particular, FIG. 1 shows host controller 102, signal buffering and retiming (SBR) circuit 104, and a plurality of DDR memories represented collectively as a single block 106. Although not required, SBR circuit 104 is preferably implemented on a single integrated circuit (IC) chip, and the elements shown in FIG. 1 are preferably configured on a single circuit board of computer system 100.

Host controller 102 transmits, to SBR circuit 104, (1) a 333-MHz differential host clock signal (clk_host_p, clk_host_n) via signal lines 108 and (2) the following address and control signals via bus 110:
- A 16-bit address signal (Address[15:0]);
- A 3-bit chip select signal (CS[2:0]);
- A 3-bit on-device termination signal (ODT[2:0]);
- A 1-bit write enable signal (WE);
- A 3-bit bank address signal (BA[2:0]);
- A 1-bit column address select signal (CAS); and
- A 1-bit row address select signal (RAS).

In addition, host controller 102 transmits (1) a reset control signal (reset_n) to SBR circuit 104 and (2) the following inter-integrated circuit (I2C) signals to SBR circuit 104 via I2C bus 112:
- A 1-bit serial data signal (SDA);
- A 1-bit serial clock signal (SCL); and
- A 25-MHz sampling clock signal (clk_i2c) used to sample both SDA and SCL.

SBR circuit 104 processes these signals received from host controller 102 (as described in further detail below) and provides the following seven sets of signals to DDR memory block 106:
(1) Address[15:0], BA[2:0], WE, CAS, RAS for port A of DDR memory block 106;
(2) Address[15:0], BA[2:0], WE, CAS, RAS for port B of DDR memory block 106;
(3) Address[15:0], BA[2:0], WE, CAS, RAS for port C of DDR memory block 106;
(4) Address[15:0], BA[2:0], WE, CAS, RAS for port D of DDR memory block 106;
(5) Eight 1-bit clock enable signals (CKE[7:0]);
(6) Eight 1-bit chip select signals (CS[7:0]) and eight 1-bit on-device termination signals (ODT[7:0]); and
(7) Twelve differential clock signals (CK[11:0]).

Depending on the particular implementation, ports A-D may be input ports on one to four different DDR memory devices. For example, each port may correspond to a different single-port DDR memory. Alternatively, any two, three, or even all four ports may correspond to a single multi-port DDR memory. For example, ports A and B might correspond to one double-port DDR memory, while ports C and D might correspond to either a second double-port DDR memory or two different single-port DDR memories.

In one possible application, the skew within each of the seven listed sets of signals is required to be within 50 picoseconds, and the delay from the host controller to the memory devices is required to be within one to three cycles of the 333-MHz host clock signal. The architecture of SBR circuit 104 is designed to meet these signal timing requirements.

As shown in FIG. 1, within SBR circuit 104, differential buffer 114 converts the 333-MHz differential host clock signal 108 received from host controller 102 into 333-MHz single-ended (SE) reference clock signal 116 for application to phase-locked loop (PLL) 118.

PLL 118 generates sixteen 1.333-GHz evenly spaced phase-offset clock signals 120 (i.e., separated by about 22.5 degrees), which are applied to phase generator 122.

Phase generator 122 generates sixty-four 333-MHz evenly spaced phase-offset clock signals 124 (i.e., separated by about 5.625 degrees), which are applied to each of twelve different phase selectors 126. Although FIG. 1 shows only eight phase selectors, SBR circuit 104 is actually implemented with twelve phase selectors, where each of ports A, B, C, and D have two phase selectors: one for a set of eight even verniers (for the eight even bits in the 16-bit address) and the other for a set of eight odd verniers (for the eight odd bits in the 16-bit address). Sets of even and odd verniers are provided for each port in order to balance the timing of all signals to that port.

Figure 2:
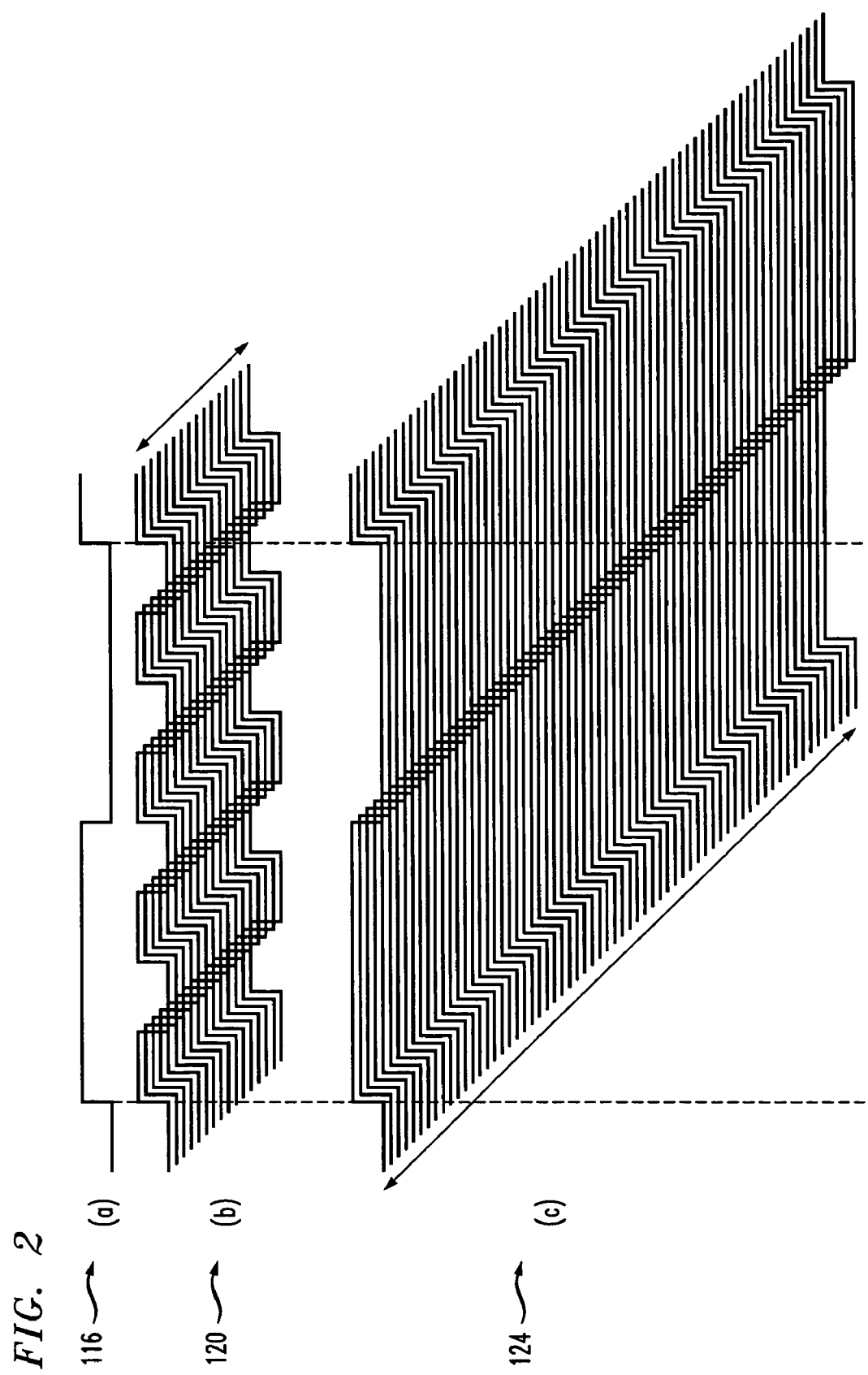
FIG. 2 represents the relative timing of clock signals 116, 120, and 124 of FIG. 1.

FIG. 2 represents the relative timing of clock signals 116, 120, and 124. In particular, FIG. 2(a) represents the 333-MHz clock signal 116, FIG. 2(b) represents the sixteen phase-offset 1.333-MHz clock signals 120 generated by PLL 118, and FIG. 2(c) represents the sixty-four phase-offset 333-MHz clock signals 124 generated by phase generator 122.

Referring again to FIG. 1, each phase selector 126 is configured to select a set of 16 contiguous clock signals 128 from the 64 clock signals received from phase generator 122, where each phase selector can be independently configured to select its own (possibly, but not necessarily, unique) set of 16 clock signals. Note that a set of 16 contiguous clock signals can "wrap around" within the circular set of 64 clock signals. For example, a phase generator can be configured to select a set of 16 contiguous clock signals consisting of the last 10 clock signals and the first 6 clock signals generated by phase generator 122.

As shown in FIG. 1, SBR circuit 104 has eight sets of verniers: one vernier set for each of the seven different sets of signals transmitted from SBR circuit 104 to DDR memory block 106 plus an eighth vernier set associated with the feedback clock signals 136 for PLL 118 (described in more detail below), where each signal bit has its own vernier. For example, the vernier set for port A has 22 different verniers: one vernier for each of the 16 bits in Address[15:0], one vernier for each of the three bits in BA[2:0], and one vernier for each of WE, CAS, and RAS. On the other hand, there are only eight verniers in the vernier set for the clock enable signals, i.e., one vernier for each of the 8 bits in CKE[7:0].

SBR circuit 104 has two different types of verniers: clock verniers (130 and 132) and non-clock verniers 134, and there are two different types of clock verniers: output clock verniers 130 and feedback clock verniers 132. Each output clock vernier 130 corresponds to a different pair of clock signals in differential clock signals CK[11:0] (transmitted to DDR memory block 106). One feedback clock vernier 132 corresponds to a single-ended feedback clock signal 136 (applied to PLL 118). The other seven feed clock verniers 132 are dummies that are used to balance the timing of the clocks. Each non-clock vernier 134 corresponds to a different address or control bit transmitted to DDR memory block 106.

Within each vernier set, the verniers all receive the same set of 16 contiguous clock signals selected by the corresponding phase selector 126. For example, all 22 verniers in the vernier set for port A receive the 16 contiguous clock signals selected by the top-most phase selector 126 shown in FIG. 1. Each vernier is configured to select one of its 16 received clock signals for use in controlling its signal bit processing, where each vernier can be independently configured to select its own (possibly, but not necessarily, unique) clock signal.

As shown in FIG. 1, signal decoder 138 receives and decodes (as appropriate) the address and control signals received from host controller 102 via bus 110. The resulting decoded address and control signals are distributed as appropriate to the different verniers in the different vernier sets via bus 140. For example, the vernier associated with the Address[0] bit for port A receives the decoded Address[0] bit via bus 140, while the vernier associated with the fourth chip select signal CS[3] receives the decoded CS[3] bit via bus 140. Note that there are verniers associated with ports B, C, and D that also receive the same Address[0] bit via bus 140. Significantly, however, those four verniers might all (although not necessarily) be driven by different selected clock signals.

The top four sets of verniers shown in FIG. 1 may be said to be "dedicated" vernier sets because each set is dedicated to processing address and control signals corresponding to a specific port of a memory device. The next three vernier sets may be said to be "shared" vernier sets because each of those sets processes control or clock signals for multiple memory devices.

Each vernier has its own output driver 144, which drives the corresponding retimed bit signal 142 generated by the vernier, either to DDR memory block 106 (for each vernier in the first seven vernier sets) or to PLL 118 (for the eighth vernier set).

As shown in FIG. 1, the eighth vernier set has eight different verniers, each of which generates a feedback clock signal 136 from (a possibly, but not necessarily, different) one of the sixteen contiguous clock signals received from the bottommost phase selector 126 shown in FIG. 1. PLL 118 is configured to use the non-dummy feedback clock signal as the PLL feedback signal for generating PLL output clock signals 120.

I2C interface 146 provides the programmability function for the internal control/status registers (not shown) in SBR circuit 104 for normal and sleep mode operations. I2C interface 146 supports an I$^2$C bus protocol as specified by the I$^2$C-Bus Specification, Version 2.1, January 2000, the teachings of which are incorporated herein by reference.

Power manager 148 ensures that SBR circuit 104 is powered up and down gracefully. Power manager 148 also performs the operation of entering SBR circuit 104 into a low-power mode by masking the host input signals and stopping the output differential clocks CK[11:0] and clock enable signals CKE[7:0].

Figure 3:
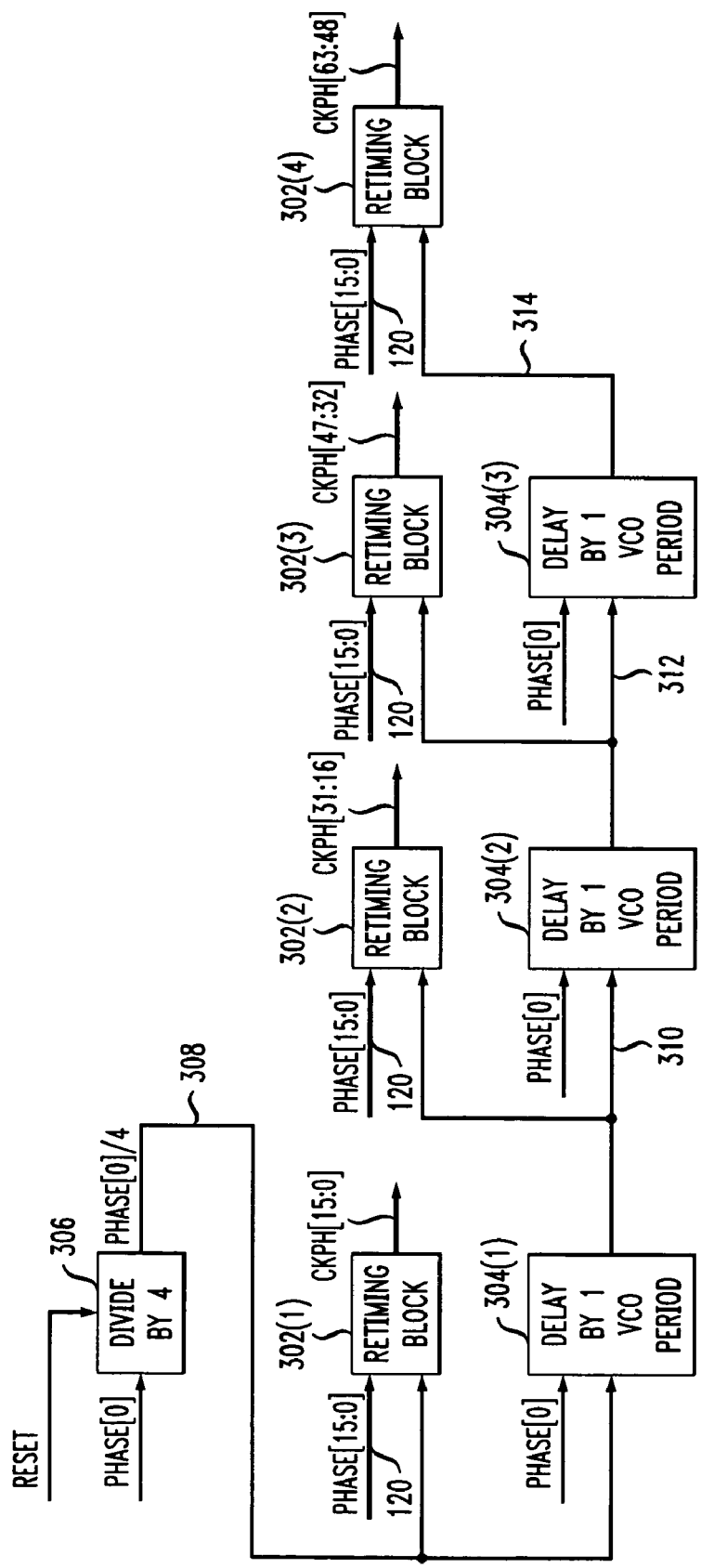
FIG. 3 shows a block diagram of the phase generator of FIG. 1.

FIG. 3 shows a block diagram of phase generator 122 of FIG. 1. Phase generator 122 receives the sixteen 1.333-GHz clock signals 120 (referred to in FIG. 3 as clock signals PHASE[15:0]) generated by PLL 118 of FIG. 1 and generates the sixty-four 333-MHz clock signals 124 (referred to in FIG. 3 as clock signals CKPH[63:0]).

In particular, each of four retiming blocks 302(1)-(4) receives the sixteen clock signals 120, and each of three delay blocks 304(1)-(3) receives the first 1.333-GHz clock signal PHASE[0]. Divider 306 divides 1.333-GHz clock signal PHASE[0] by a factor of 4 to generate 333-MHz clock signal 308, which is applied to both first retiming block 302(1) and first delay block 304(1).

Based on clock signal 308, first retiming block 302(1) generates the first set of 16 clock signals CKPH[15:0] of the 64 clock signals 124.

First delay block 304(1) delays 333-MHz clock signal 308 by one clock cycle of 1.333-GHz clock signal PHASE[0] and applies the resulting first-delayed clock signal 310 to both second retiming block 302(2) and second delay block 304(2).

Based on first-delayed clock signal 310, second retiming block 302(2) generates the second set of 16 clock signals CKPH[31:16] of the 64 clock signals 124.

Second delay block 304(1) delays 333-MHz first-delayed clock signal 310 by one clock cycle of 1.333-GHz clock signal PHASE[0] and applies the resulting second-delayed clock signal 312 to both third retiming block 302(3) and third delay block 304(3).

Based on second-delayed clock signal 312, third retiming block 302(3) generates the third set of 16 clock signals CKPH[47:32] of the 64 clock signals 124.

Third delay block 304(3) delays 333-MHz second-delayed clock signal 312 by one clock cycle of 1.333-GHz clock signal PHASE[0] and applies the resulting third-delayed clock signal 314 to fourth retiming block 302(4).

Based on third-delayed clock signal 314, fourth retiming block 302(4) generates the fourth (and last) set of 16 clock signals CKPH[63:48] of the 64 clock signals 124.

Each phase selector 126 is essentially a multiplexer that receives 64 phase-offset clock signals 124 from phase generator 122 and outputs a set of 16 contiguous clock signals 128 based on a 6-bit control signal (i.e., having values from 0 to 63) that identifies which of the 64 received clocks 124 is to be the first of the 16 output clocks 128 (also referred to as the start phase). When the start phase is any of 16-31 or 48-63, the corresponding 16 contiguous clock signals 128 are inverted. To handle this clock-bus inversion downstream, each phase selector 126 also generates a 1-bit FLIP signal (not shown in FIG. 1), whose value is set (e.g., to logical 1), if the clock bus is inverted, and reset (e.g., to logical 0), if the clock bus is not inverted. This FLIP signal is applied to each vernier that receives the corresponding set of 16 contiguous clock signals 128.

Verniers

Figure 4:
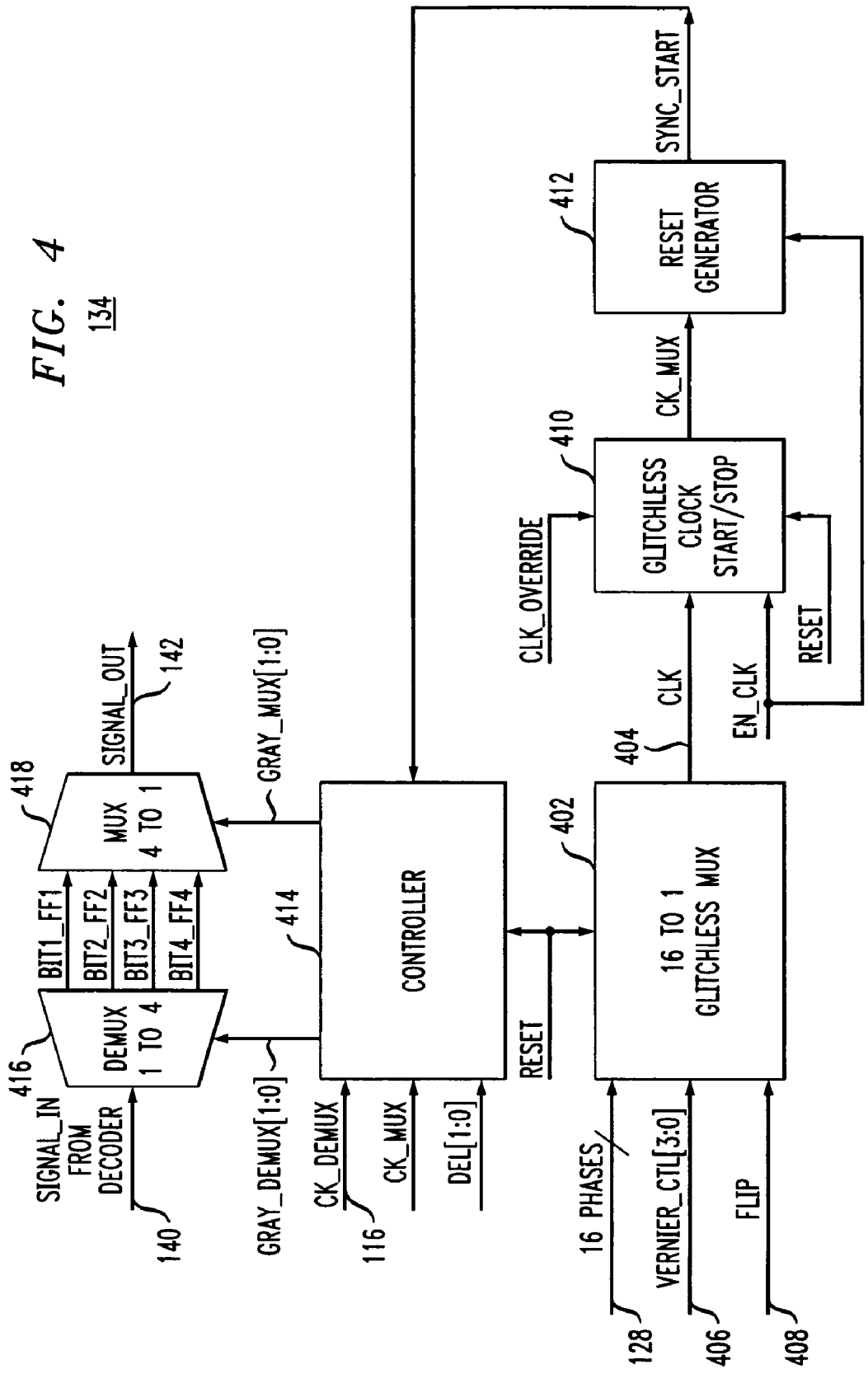
FIG. 4 shows a block diagram of each non-clock vernier of FIG. 1.

FIG. 4 shows a block diagram of each non-clock vernier 134 of FIG. 1. Non-clock vernier 134 (1) receives (a) a corresponding bit of decoded address or control data from bus 140 (as Signal_In) and (b) the 16 contiguous clock signals 128 selected by the corresponding phase selector 126 of FIG. 1 and (2) selects one of those 16 clocks for use in retiming the received data bit to provide that retimed data bit as Signal_Out (i.e., signal 142 in FIG. 1) to the corresponding output driver 144 of FIG. 1.

In particular, 16-to-1 glitchless mux 402 selects retiming clock 404 from the 16 contiguous clocks 128 based on a 4-bit vernier control signal 406 (Vernier_Ctl[3:0]) and the FLIP signal 408 generated by the corresponding phase selector 126 of FIG. 1. Note that, if the FLIP signal is set, then mux 402 inverts the selected clock 128 to generate retiming clock 404.

Figure 5:
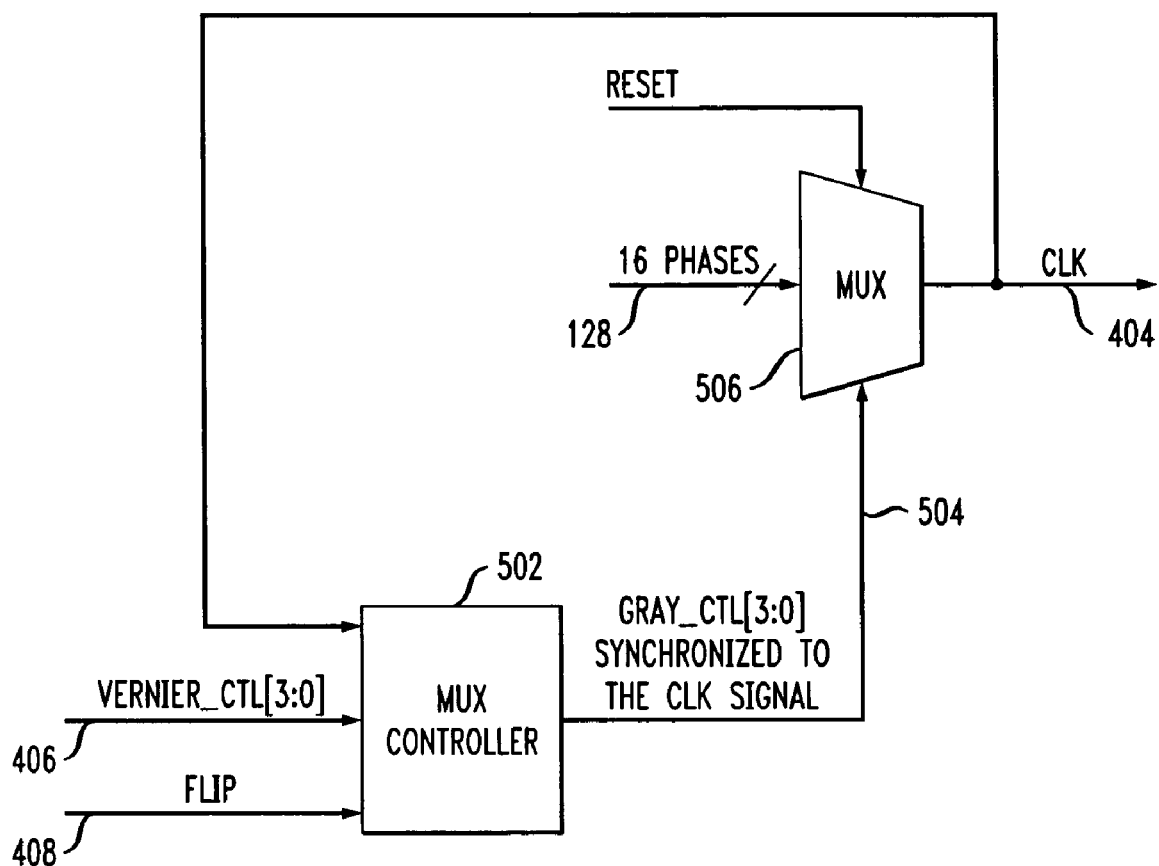
FIG. 5 shows a block diagram of a glitchless 16:1 mux that can be used for the 16-to-1 glitchless mux of FIG. 4.

FIG. 5 shows a block diagram of a glitchless 16:1 mux 500 that can be used for 16-to-1 glitchless mux 402 of FIG. 4. 16-to-1 mux 506 receives the 16 contiguous clocks 128 and selects retiming clock 404 based on a 4-bit gray-coded mux control signal 504 (Gray_Ctl[3:0]) generated by mux controller 502. Mux controller 502 synchronizes vernier control signal 406 based on retiming clock 404 to generate mux control signal 504. Mux controller 502 uses a circuit technique that can guarantee zero chance of metastability. In particular, mux controller 502 continuously monitors vernier control signal 406. If mux controller 502 senses a change in the bus, mux controller 502 will update its state machine accordingly, but only when clocks 128 are low so that glitches will not appear in the output of mux 506 (i.e., retiming clock 404). In addition, the software that generates vernier control signal 406 is designed to limit the frequency of changes in vernier control signal 406 to no more than once every, e.g., 6 clock cycles in order to give mux controller 502 enough time to sense the change and react appropriately (i.e., change the selection of contiguous clocks 128 for retiming clock 404 made by mux 506).

Mux controller 502 converts the 4-bit binary vernier control signal 406 into the 4-bit gray-coded mux control signal 504, which is synchronized to retiming clock 404 from 16-to-1 mux 506. Mux controller 502 modifies mux control signal 504, as appropriate, based on the value of the FLIP signal 408 to produce desired muxing by mux 506.

For example, if the FLIP signal 408 is 0, then mux controller 502 generates mux control signal 504 to be the same as vernier control signal 406, such that, if vernier control signal

406 is [0000], then mux control signal 504 is [0000], and mux 506 selects the phase 0 clock of contiguous clocks 128 for retiming clock 404. Similarly, if vernier control signal 406 is [0001], then mux control signal 504 is [0001], and mux 506 selects the phase 1 clock of contiguous clocks 128 for retiming clock 404, and so on for the other 14 values of vernier clock signal 406.

However, if the FLIP signal 408 is 1, then mux controller 502 generates mux control signal 504 to be the complement of vernier control signal 406, such that, if vernier control signal 406 is [0000], then mux control signal 504 is [1111], and mux 506 selects the phase 15 clock of contiguous clocks 128 for retiming clock 404. Similarly, if vernier control signal 406 is [0001], then mux control signal 504 is [1110], and mux 506 selects the phase 14 clock of contiguous clocks 128 for retiming clock 404, and so on for the other 14 values of vernier clock signal 406.

Referring again to FIG. 4, glitchless clock start/stop block 410 enables mux clock CK_MUX in a smooth manner after PLL 118 of FIG. 1 has locked. Start/stop block 410 is also responsible for shutting down mux clock CK_MUX low in a smooth manner prior to entering PLL reset, where mux clock CK_MUX is always stopped low. In particular, under normal operating conditions, when the clock enable control signal EN_CLK goes from low (i.e., disabled) to high (i.e., enabled), retiming clock 404 begins to propagate as mux clock CK_MUX on the next rising edge of retiming clock 404 (i.e., at the start of the next clock cycle). Similarly, when EN_CLK goes from high to low, retiming clock 404 ceases propagating as CK_MUX on the next falling edge of retiming clock 404 (i.e., at the end of the current clock cycle).

The clock override control signal CLK_OVERRIDE allows start/stop block 410 to be controlled by I2C interface 146 of FIG. 1. In particular, if CLK_OVERRIDE=1, then CLK_OUT is enabled irrespective of the polarity on EN_CLK. This override function, which is asynchronous, provides a fail-safe mode to be used in case the clock enable control signal EN_CLK malfunctions. The reset control signal RESET holds the output flip-flops (not shown) in start/stop block 410 to a low value.

After the clocks are enabled from start/stop block 410, reset generator 412 sets the sync start control signal SYNC_START so that demux/mux synchronization (explained below) can begin.

Controller 414 receives demux clock CK_DEMUX (i.e., clock 116 of FIG. 1) and mux clock CK_MUX (from start/stop block 410) and generates 2-bit gray-coded controls signals GRAY_DEMUX[1:0] and GRAY_MUX[1:0] for application to 1-to 4 demux 416 and 4-to-1 mux 418, respectively, to synchronize the demux/mux section. The 2-bit delay control signal DEL[1:0] extends the programmable phases for each vernier from the 64 different phases per one cycle of the 333-MHz host clock signal 108 of FIG. 1 to the 256 different phase over four host-clock cycles. The value of DEL determines how many host-clock cycles to delay before enabling the demux/mux section.

Demux 416 converts serial data stream Signal_In into four parallel data streams (BIT1_FF1, BIT2_FF2, BIT3_FF3, and BIT4_FF4) based on 2-bit demux control signal Gray_Demux[1:0], while mux 418 serializes the four parallel data streams received from demux 416 based on 2-bit control signal Gray_Mux[1:0]. In this way, serial input data stream Signal_In is retimed to generate retimed serial output data stream Signal_Out.

Changing vernier 134 by one LSB at a time, either up or down (i.e., incrementing or decrementing the value of control signal 406 by one bit, which in turn changes the values of Gray_Demux and Gray_Mux by one bit), does not disturb the synchronization of demux 416 and mux 418. Neither does such a change produce significant jitter. As a result, there is no need to cycle through a sleep mode every time vernier 134 is changed by one LSB. However, if vernier 134 is changed by more than one LSB at a time, then vernier 134 should cycle through the sleep mode to re-activate synchronization. Sleep mode is designed to (i) stop the internal clock to consume less power and (ii) hold the signals on the ports static.

Figure 6:
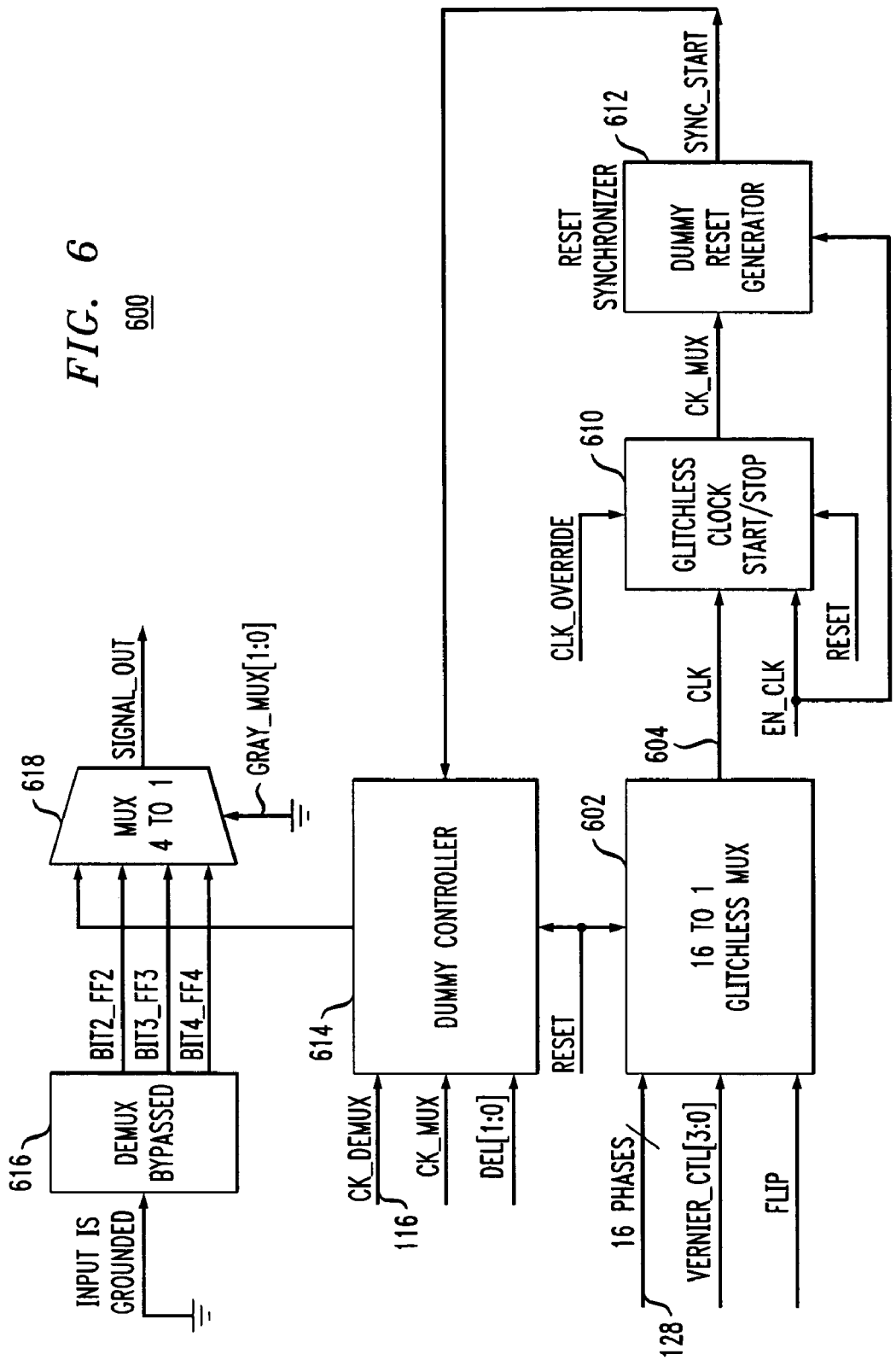
FIG. 6 shows a block diagram of a clock vernier that can be used for each output clock vernier and each feedback clock vernier of FIG. 1.

FIG. 6 shows a block diagram of a clock vernier 600, which can be used for each output clock vernier 130 and each feedback clock vernier 132 of FIG. 1. Clock vernier 600 has an architecture similar to non-clock vernier 134 of FIG. 4, but with certain significant differences. As to similarities, 16-to-1 glitchless mux 602, glitchless clock start/stop block 610, and mux 618 may be implemented identical to mux 402, block 410, and mux 418 of FIG. 4.

As to differences, clock vernier 600 does not use a demux similar to demux 416 of FIG. 4. Rather, demux 616 is either bypassed or even omitted from clock vernier 600. As shown in FIG. 6, the last three data inputs to mux 618 and the 2-bit control signal Gray_Mux are tied to ground to ensure that mux 618 always outputs its first data input as Signal_Out.

Furthermore, dummy blocks 612 and 614 mimic the processing of reset generator 412 and controller 414 of FIG. 4, respectively, to provide equivalent signal propagation delays.

Broadening

The present invention has been described in the context of computer system 100 of FIG. 1 in which SBR circuit 104. In general, the present invention can be implemented in the context of SBR circuits for computer systems in which:

The host clock signal has a frequency other than 333 MHz and/or is single-ended rather than differential;

The PLL-based clock generation circuitry (e.g., PLL 118 and phase generator 122 in FIG. 1) generates other than 64 phase-offset clock signals and/or at frequencies other than 333 MHz;

The PLL-based clock generation circuitry generates other than 16 phase-offset intermediate clock signals (e.g., clock signals 120 in FIG. 1) and/or at frequencies other than 1.333 MHz;

There are different numbers of memory blocks having other than four ports A-B;

There are different numbers of vernier sets;

There are different sets of signals and/or different numbers of verniers in the various vernier sets; and Different numbers and/or types of address and control signals are handled by the SBR circuit.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. A signal buffering and retiming (SBR) circuit for buffering and retiming signals for parallel application to a plurality of memory devices, the SBR circuit comprising:
    a PLL-based clock generator adapted to generate a set of phase-shifted clock signals from an input clock signal;
    a plurality of phase selectors, each phase selector adapted to independently select a subset of contiguous clock signals from the set of phase-shifted clock signals;
    a set of one or more output clock verniers, each output clock vernier adapted to (1) receive a corresponding subset of contiguous clock signals from a corresponding phase selector, (2) select one of the contiguous clock signals as its retiming clock, and (3) generate, using its retiming clock, an output clock signal for at least one of the memory devices;
    a set of one or more feedback clock verniers, each feedback clock vernier adapted to (1) receive a corresponding subset of contiguous clock signals from a corresponding phase selector, (2) select one of the contiguous clock signals as its retiming clock, and (3) generate, using its retiming clock, a feedback clock signal provided to the PLL-based clock generator; and
    one or more sets of non-clock verniers, each non-clock vernier adapted to (1) receive a corresponding subset of contiguous clock signals from a corresponding phase selector, (2) select one of the contiguous clock signals as its retiming clock, (3) receive a bit of address or control data, and (4) generate, using its retiming clock, a retimed bit signal from the bit of address or control data for at least one of the memory devices.

2. The invention of claim 1, wherein the PLL-based clock generator is adapted to be configured to select any one of the one or more feedback clock signals for use in generating the set of phase-shifted clock signals from the input clock signal.

3. The invention of claim 1, wherein:
    each phase selector can be configured to select its corresponding subset of contiguous clock signals independently of every other phase selector; and
    each vernier can be configured to select its retiming clock signal independent of every other vernier.

4. The invention of claim 1, wherein the PLL-based clock generator comprises:
    a PLL adapted to generate a set of phase-shifted high-rate clock signals from the input clock signal and one of the one or more feedback clock signals; and
    a phase generator adapted to generate the set of phase-shifted clock signals from the set of phase-shifted high-rate clock signals.

5. The invention of claim 4, wherein:
    the phase-shifted clock signals have the same clock rate as the input clock signal;
    the phase-shifted high-rate clock signals have a higher clock rate than the phase-shifted clock signals; and
    the number of phase-shifted clock signals is greater than the number of phase-shifted high-rate clock signals.

6. The invention of claim 4, wherein:
    the memory devices are DDR memories; and
    the PLL-based clock generator further comprises a differential buffer adapted to generate the input clock signal from a received differential clock signal.

7. The invention of claim 1, wherein each phase selector corresponds to a different set of verniers.

8. The invention of claim 7, wherein:
    the plurality of vernier sets comprises two or more dedicated vernier sets and one or more shared vernier sets;
    each memory device has at least one corresponding dedicated vernier set; and
    at least one shared vernier set is shared by all of the memory devices.

9. The invention of claim 1, further comprising a signal decoder adapted to decode received address and control signals to generate a plurality of decoded address and control bits, where each decoded address or control bit is provided to at least one non-clock vernier.

10. The invention of claim 9, wherein at least one decoded address or control bit is provided to two or more different non-clock verniers located in different vernier sets.

11. The invention of claim 1, wherein each non-clock vernier is adapted to (i) demultiplex the received bit of address or control data to generate a parallel stream of data and (ii) multiplex the parallel stream of data based on its retiming clock to generate the retimed bit signal.

12. The invention of claim 1, wherein the SBR circuit is implemented on a single integrated circuit chip.

13. The invention of claim 1, wherein:
    the PLL-based clock generator is adapted to be configured to select any one of the one or more feedback clock signals for use in generating the set of phase-shifted clock signals from the input clock signal;
    each phase selector can be configured to select its corresponding subset of contiguous clock signals independently of every other phase selector;
    each vernier can be configured to select its retiming clock signal independent of every other vernier;
    the PLL-based clock generator comprises:
        a differential buffer adapted to generate the input clock signal from a received differential clock signal;
        a PLL adapted to generate a set of phase-shifted high-rate clock signals from the input clock signal and one of the one or more feedback clock signals; and a phase generator adapted to generate the set of phase-shifted clock signals from the set of phase-shifted high-rate clock signals;

the phase-shifted clock signals have the same clock rate as the input clock signal;

the phase-shifted high-rate clock signals have a higher clock rate than the phase-shifted clock signals;

the number of phase-shifted clock signals is greater than the number of phase-shifted high-rate clock signals;

the memory devices are DDR memories;

each phase selector corresponds to a different set of verniers;

the plurality of vernier sets comprises two or more dedicated vernier sets and one or more shared vernier sets;

each memory device has at least one corresponding dedicated vernier set;

at least one shared vernier set is shared by all of the memory devices;

further comprising a signal decoder adapted to decode received address and control signals to generate a plurality of decoded address and control bits, where each decoded address or control bit is provided to at least one non-clock vernier;

at least one decoded address or control bit is provided to two or more different non-clock verniers located in different vernier sets;

each non-clock vernier is adapted to (i) demultiplex the received bit of address or control data to generate a parallel stream of data and (ii) multiplex the parallel stream of data based on its retiming clock to generate the retimed bit signal; and the SBR circuit is implemented on a single integrated circuit chip.

14. A method for buffering and retiming signals for parallel application to a plurality of memory devices, the method comprising:

generating a set of phase-shifted clock signals from an input clock signal;

independently selecting a plurality of subsets of contiguous clock signals from the set of phase-shifted clock signals;

for a first subset of contiguous clock signals, selecting one of the contiguous clock signals as a first retiming clock and generating, using the first retiming clock, an output clock signal for at least one of the memory devices;

for a second subset of contiguous clock signals, selecting one of the contiguous clock signals as a second retiming clock and generating, using the second retiming clock, a feedback clock signal for use in generating the set of phase-shifted clock signals; and for each other subset of contiguous clock signals, selecting one of the contiguous clock signals as an other retiming clock and generating, using the other retiming clock, a retimed bit signal from a received bit of address or control data for at least one of the memory devices.

15. The invention of claim 14, wherein:

each subset of contiguous clock signals is selected independently of every other phase selector; and each retiming clock is selected independently of every other retiming clock.

16. The invention of claim 14, wherein the set of phase-shifted clock signals is generated by:

generating, using a PLL, a set of phase-shifted high-rate clock signals from the input clock signal and one of the one or more feedback clock signals; and generating the set of phase-shifted clock signals from the set of phase-shifted high-rate clock signals.

17. The invention of claim 16, wherein:

the phase-shifted clock signals have the same clock rate as the input clock signal;

the phase-shifted high-rate clock signals have a higher clock rate than the phase-shifted clock signals; and the number of phase-shifted clock signals is greater than the number of phase-shifted high-rate clock signals.

18. The invention of claim 14, further comprising decoding received address and control signals to generate a plurality of decoded address and control bits, where each decoded address or control bit is provided to at least one non-clock vernier.

19. The invention of claim 14, wherein the retimed bit signal is generated by (i) demultiplexing the received bit of address or control data to generate a parallel stream of data and (ii) multiplexing the parallel stream of data based on its retiming clock to generate the retimed bit signal.

20. Apparatus for buffering and retiming signals for parallel application to a plurality of memory devices, the apparatus comprising:

means for generating a set of phase-shifted clock signals from an input clock signal;

means for independently selecting a plurality of subsets of contiguous clock signals from the set of phase-shifted clock signals;

means, for a first subset of contiguous clock signals, for selecting one of the contiguous clock signals as a first retiming clock and generating, using the first retiming clock, an output clock signal for at least one of the memory devices;

means, for a second subset of contiguous clock signals, for selecting one of the contiguous clock signals as a second retiming clock and generating, using the second retiming clock, a feedback clock signal for use in generating the set of phase-shifted clock signals; and means, for each other subset of contiguous clock signals, for selecting one of the contiguous clock signals as an other retiming clock and generating, using the other retiming clock, a retimed bit signal from a received bit of address or control data for at least one of the memory devices.

* * * * *